US011254826B2

United States Patent
Chang et al.

(10) Patent No.: US 11,254,826 B2
(45) Date of Patent: Feb. 22, 2022

(54) OXIDATION-RESISTANT CONDUCTIVE COPPER PASTE, METHOD FOR PREPARATION THEREOF AND METHOD FOR MANUFACTURING CONDUCTIVE FILM

(71) Applicant: GECKOS TECHNOLOGY CORP., Zhubei (TW)

(72) Inventors: Wei-Chen Chang, Zhubei (TW); Tsung-Huan Sheng, Zhubei (TW)

(73) Assignee: Geckos Technology Corp., Zhubei (TW)

( * ) Notice: Subject to any disclaimer, the term of this patent is extended or adjusted under 35 U.S.C. 154(b) by 0 days.

(21) Appl. No.: 16/749,220

(22) Filed: Jan. 22, 2020

(65) Prior Publication Data
US 2020/0407569 A1    Dec. 31, 2020

(30) Foreign Application Priority Data

Jun. 25, 2019   (TW) .................................. 108122143

(51) Int. Cl.
*C09D 5/24* (2006.01)
*C09D 7/40* (2018.01)
(Continued)

(52) U.S. Cl.
CPC ................. *C09D 5/24* (2013.01); *C09D 7/20* (2018.01); *C09D 7/61* (2018.01); *C09D 7/65* (2018.01);
(Continued)

(58) Field of Classification Search
USPC ........................................................ 252/500
See application file for complete search history.

(56) References Cited

U.S. PATENT DOCUMENTS

| 2013/0192671 | A1* | 8/2013 | Hang | ................ | H01L 31/02167 |
| | | | | | 136/256 |
| 2014/0220732 | A1* | 8/2014 | Liu | ......................... | H01L 31/18 |
| | | | | | 438/98 |

(Continued)

FOREIGN PATENT DOCUMENTS

| CN | 10766348 | * | 2/2018 |
| CN | 108172320 | A | 6/2018 |
| TW | I629337 | B | 7/2018 |

*Primary Examiner* — Brian K Talbot
(74) *Attorney, Agent, or Firm* — Rosenberg, Klein & Lee

(57) ABSTRACT

The present invention discloses an oxidation-resistant conductive copper past, a manufacturing method and a use thereof. The oxidation-resistant conductive copper paste comprises 70 wt % to 90 wt % of copper particles, a binder, a thixotropic agent and a solvent. The manufacturing method comprises the steps of mixing the binder, the thixotropic agent and ethanol thoroughly to obtain a first mixture; mixing the solvent with the first mixture thoroughly to obtain a second mixture; mixing the copper particles with the second mixture to obtain a conductive copper paste precursor; and removing the ethanol from the conductive copper paste precursor to obtain the oxidation-resistant conductive copper paste. The oxidation-resistant conductive copper paste can be used for manufacturing a conductive film of a circuit board or an electrode of a solar battery by a printing process.

4 Claims, 6 Drawing Sheets
(3 of 6 Drawing Sheet(s) Filed in Color)

(51) Int. Cl.
*C09D 7/61* (2018.01)
*C09D 7/65* (2018.01)
*C09D 7/20* (2018.01)
*C09D 101/26* (2006.01)
*C09D 161/06* (2006.01)
*C09D 163/00* (2006.01)
*C09D 11/52* (2014.01)
*C09D 11/037* (2014.01)
*C09D 11/033* (2014.01)
*C09D 11/14* (2006.01)
*C09D 11/103* (2014.01)
*C09D 11/102* (2014.01)
*C09D 11/322* (2014.01)
*C09D 11/36* (2014.01)
*H01B 1/16* (2006.01)
*H01B 1/22* (2006.01)
*H01L 31/0224* (2006.01)
*H05K 1/09* (2006.01)

(52) U.S. Cl.
CPC ............... *C09D 7/67* (2018.01); *C09D 7/68* (2018.01); *C09D 7/69* (2018.01); *C09D 11/033* (2013.01); *C09D 11/037* (2013.01); *C09D 11/102* (2013.01); *C09D 11/103* (2013.01); *C09D 11/14* (2013.01); *C09D 11/322* (2013.01); *C09D 11/36* (2013.01); *C09D 11/52* (2013.01); *C09D 101/26* (2013.01); *C09D 161/06* (2013.01); *C09D 163/00* (2013.01); *H01B 1/16* (2013.01); *H01B 1/22* (2013.01); *H01L 31/0224* (2013.01); *H05K 1/097* (2013.01)

(56) References Cited

U.S. PATENT DOCUMENTS

2015/0249167 A1\* 9/2015 Zhang ............... H01B 13/0016
427/123
2015/0282318 A1\* 10/2015 Thimm ................... H01B 1/16
174/264

\* cited by examiner

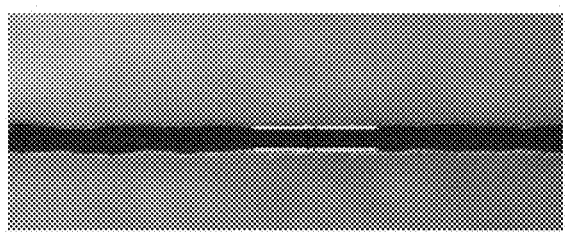
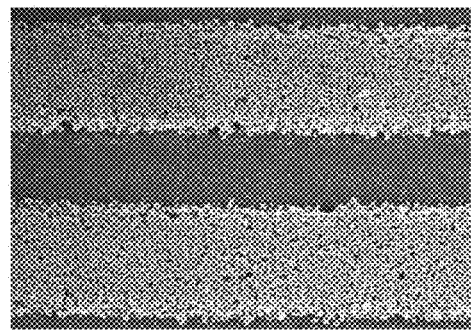
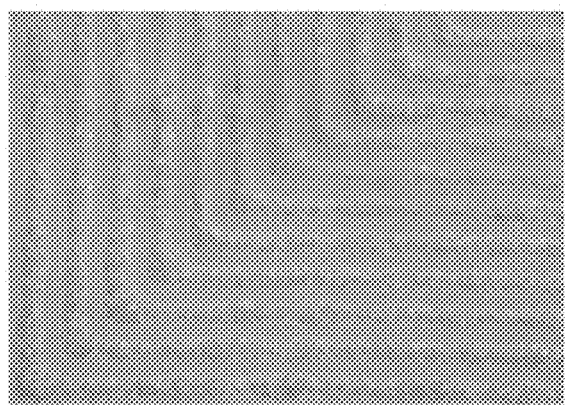
FIG. 4(A)          FIG. 4(B)

OXIDATION-RESISTANT CONDUCTIVE COPPER PASTE, METHOD FOR PREPARATION THEREOF AND METHOD FOR MANUFACTURING CONDUCTIVE FILM

BACKGROUND OF THE INVENTION

1. Field of the Invention

The present invention relates to an oxidation-resistant conductive copper paste, a method for preparation thereof and a method for manufacturing a conductive film comprising the same in which the oxidation-resistant conductive copper paste has improved dispersity and is not easily oxidized.

2. Description of Related Art

It is important to minimize electronic products especially personally portable electronic products in the development of the electronic products, so the minimization of electronic parts or circuit boards is an important direction for research and development. Conductive colloid is a substance having conductivity after curing or drying and is used as electrical conducting substance for the electronic parts. In addition, the conductive paste can be coated on a substrate by a high-precision printing method or a high-precision processing method to form a circuit for manufacturing a thin and light circuit board. The conductive colloid is also used for manufacturing electrodes of a solar battery and a gum of a laminated solar panel due to characteristics of modeling by coating and great conductivity.

The current conductive colloid includes conductive silver paste and conductive aluminum colloid in which the conductive silver colloid is expensive and the conductive aluminum colloid is easily curled and deformed due to high contractility. Therefore, there is still a need to develop a conductive colloid or a conductive paste having low cost and high stability.

SUMMARY OF THE INVENTION

The present invention discloses an oxidation-resistant conductive copper paste, a method for preparation thereof and a method for manufacturing a conductive film comprising the conductive copper paste in which the oxidation-resistant conductive copper paste has evenly dispersed copper particles and has high conductivity and high resistance to oxidation.

The oxidation-resistant copper paste comprises 70 wt % to 90 wt % of conductive particles, 4 wt % to 16 wt % of a binder, 0.5 wt % to 7 wt % of a thixotropic agent and 5 wt % to 25 wt % of a solvent. The conductive particles are selected from the group consisting of nano-sized copper particles, submicron-sized copper particles and micron-sized copper particles. And the binder comprises an organic resin and an inorganic compound.

The manufacturing method of an oxidation-resistant conductive copper paste comprises: step 1, mixing a binder, a thixotropic agent and an anhydrous ethanol thoroughly to obtain a first mixture, wherein the binder comprises an organic resin and an inorganic compound; step 2, mixing a solvent with the first mixture thoroughly to obtain a second mixture; step 3, mixing a plurality of conductive particles with the second mixture thoroughly by a blender to obtain a conductive copper paste precursor, wherein the plurality of conductive particles is selected form the group consisting of nano-sized copper particles, submicron-sized copper particles and micron-sized copper particles; and step 4, removing the anhydrous ethanol from the conductive copper paste precursor to obtain the oxidation-resistant conductive copper paste.

A method for manufacturing a conductive film is also disclosed which comprises applying the conductive copper paste onto a substrate and thermally curing the conductive copper paste under a normal atmosphere to form a conductive film on the substrate, for a conductive substrate.

In an embodiment of the present invention, each of the conductive particles has a diameter ranging from 50 nm to 3000 nm.

In an embodiment of the present invention, the organic resin is selected from the group consisting of a cellulose ether, a phenol-formaldehyde resin and a phenolic epoxy resin, and the inorganic compound is silicon dioxide ($SiO_2$) or stannous oxide ($SnO_2$).

In an embodiment of the present invention, the thixotropic agent is a polyamide wax or an oxidized polyethylene wax.

In an embodiment of the present invention, the solvent is selected from a group consisting of diethylene glycol monobutyl ether, terpineol and 2, 2, 4-trimethyl-1, 3-pentanediol mono (2-methylpropanoate).

In an embodiment of the present invention, the conductive copper paste is applied on the substrate by means selected from the group consisting of screen printing, coating, dip-coating, spray coating, ink-jet printing and combinations thereof.

In an embodiment of the present invention, the substrate is a glass substrate, an indium tin oxide glass substrate, a flexible polyamide substrate, a modified polyamide substrate, a polyethylene terephthalate substrate, an electroless nickel immersion gold substrate, a biaxially-oriented polyethylene terephthalate substrate, a silicon substrate, a copper foil substrate, a copper foil soft substrate, a FR4 glass fiber board, a liquid-crystal polymer board or a ceramic board.

In an embodiment of the present invention, the conductive copper paste is thermally cured on the substrate at a temperature of 140° C. to 850° C. for 5 minutes to 120 minutes.

In an embodiment of the present invention, the conductive copper paste is screen printed on the substrate by use of a screen printing plate having a mesh count ranging from 32 meshes to 520 meshes.

In an embodiment of the present invention, the conductive copper paste screen-printed on the substrate has a thickness ranging from 5 μm to 200 μm, and a line width of at least 40 μm.

In an embodiment of the conductive substrate has an electrical resistance ranging from $10^{-3}$ Ω-cm to $10^{-7}$ Ω-cm.

Accordingly, the oxidation-resistant conductive copper paste manufactured by the method of the present invention has composition evenly distributed and has great dispersity and conductivity. Furthermore, the oxidation-resistant conductive copper paste can adhere to a substrate firmly.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 2 (B) is a 10000 times-magnified scanning electron microscope photograph showing an oxidation-resistant conductive copper paste after curing of the present invention;

FIG. 3 (B) is a photograph showing an electrode of a solar battery made of an oxidation-resistant conductive copper paste of the present invention;

FIG. 4 (A) is an optical microscope photograph showing a printing precision of an oxidation-resistant conductive copper paste of the present invention;

FIG. 4 (B) is an electron microscope photograph showing a printing precision of an oxidation-resistant conductive copper paste of the present invention;

FIG. 6 (B) is a second analysis diagram showing sheet resistance of an oxidation-resistant conductive copper paste of the present invention.

DETAILED DESCRIPTION OF THE PREFERRED EMBODIMENT

To provide a thorough understanding, the purpose and advantages of the present invention will be described in detail with reference to the accompanying drawings.

I. Method for Preparation an Oxidation-Resistant Conductive Copper Paste

The oxidation-resistant conductive copper paste of the present invention comprises 70 wt % to 90 wt % of conductive particles, 4 wt % to 16 wt % of a binder, 0.5 w % to 7 wt % of a thixotropic agent, and 5 wt % to 25 wt % of a solvent. Preferably, the oxidation-resistant conductive copper paste comprises 80 wt % to 90 wt % of the conductive particles, 4 wt % to 16 wt % of the binder, 0.5 w % to 7 wt % of the thixotropic agent and 5 wt % to 15 wt % of the solvent.

The conductive particles in the oxidation-resistant conductive copper paste of the present invention are selected from the group consisting of nano-sized copper particles, submicron-sized copper particles and micron-sized copper particles and each of the conductive particles has a diameter ranging from 50 nm to 3000 nm. The binder comprises an organic resin and an inorganic compound. The organic resin is selected from the group consisting of a cellulose ether, a phenol-formaldehyde resin and a phenolic epoxy resin, and the inorganic compound is silicon dioxide ($SiO_2$) or stannous oxide ($SnO_2$). The ratio of the organic resin and the inorganic compound is ranging from 1:0.1 to 1:10 by weight. The thixotropic agent is a polyamide wax or an oxidized polyethylene wax. And the solvent is selected from the group consisting of diethylene glycol monobutyl ether, terpineol and 2, 2, 4-trimethyl-1, 3-pentanediol mono (2-methylpropanoate).

Figure 1:
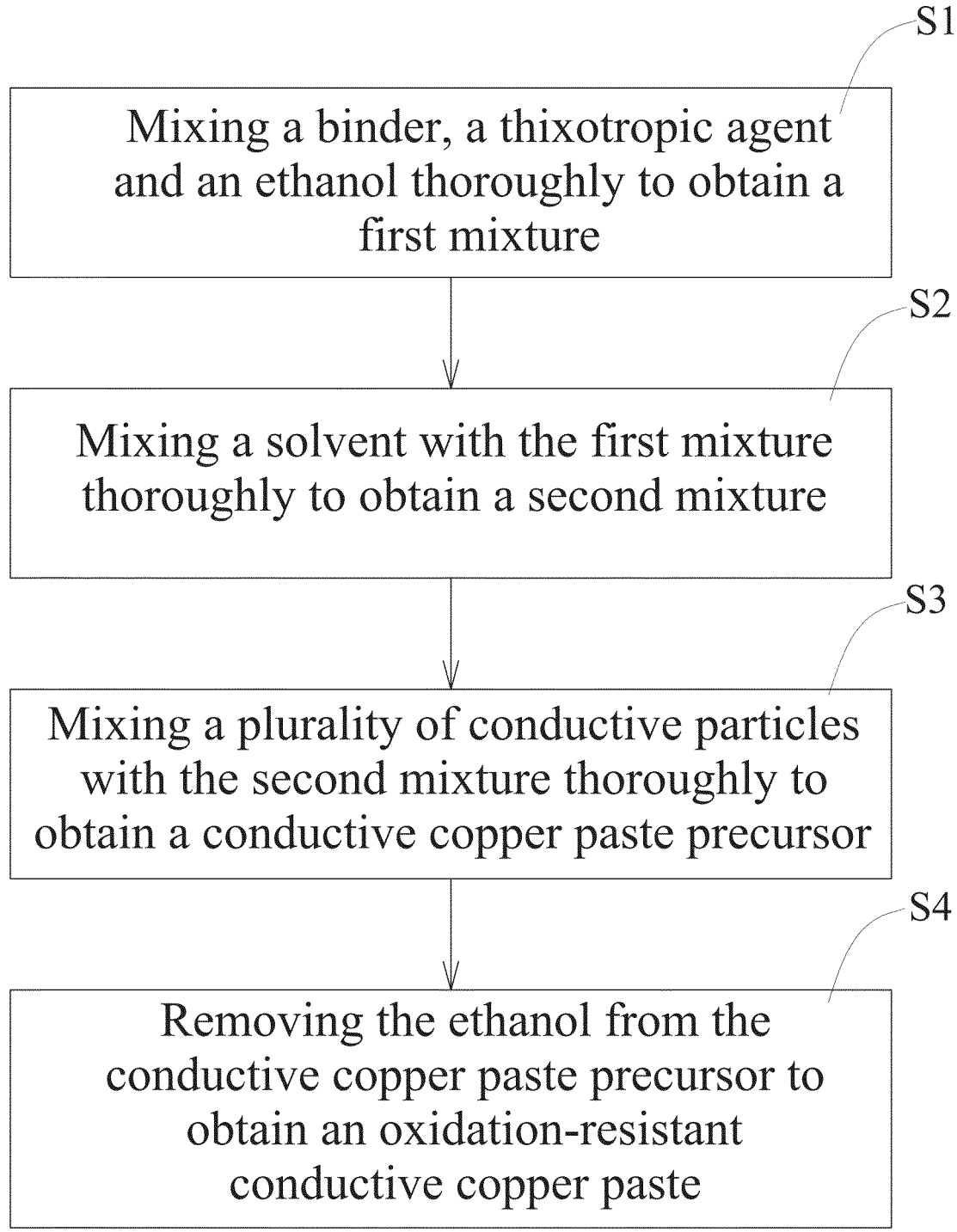
FIG. 1 is a flow chart showing a method for manufacturing an oxidation-resistant conductive copper paste of the present invention.

Referring to FIG. 1, the method for preparation of the present invention comprises the steps of step 1 (S1), mixing a binder, a thixotropic agent and ethanol thoroughly to obtain a first mixture, wherein the binder comprises an organic resin and an inorganic compound; step 2 (S2), mixing a solvent with the first mixture thoroughly to obtain a second mixture; step 3 (S3), mixing a plurality of conductive particles with the second mixture thoroughly to obtain a conductive copper paste precursor, wherein the plurality conductive particles is selected from the group consisting of nano-sized copper particles, submicron-sized copper particles and micron-sized copper particles; and step 4 (S4), removing the ethanol from the conductive copper paste precursor to obtain the oxidation-resistant conductive copper paste of the present invention. The ethanol used in the step 1 (S1) is anhydrous ethanol.

The binder in the present invention provides viscosity and bonds the conductive particles together to form a conductive circuit. The binder of the present invention comprises an organic resin and an inorganic compound, the organic resin is selected from the group consisting of a cellulose ether, a phenol-formaldehyde resin and a phenolic epoxy resin.

The cellulose ether is a high molecular compound made of cellulose and has an ether structure, and the cellulose ether is classified into three types including anionic type, cationic type and non-ionic type. The cellulose ether is thermoplastic and used as thickener or dispersant. The cellulose ether used in the present invention can be one of methyl cellulose, carboxymethylcellulose, ethyl cellulose, benzyl cellulose, hydroxyethyl cellulose, hydroxypropyl methylcellulose, cyanoethyl cellulose, benzyl hydroxyethyl cellulose and carboxymethyl hydroxyethyl cellulose.

The phenol-formaldehyde resin is heat resistant, flame resistant and water resistant, and has high bonding strength. The phenol-formaldehyde resin is classified into thermosetting phenol-formaldehyde resin and thermalplastic phenol-formaldehyde resin. The phenolic epoxy resin has a high content of epoxy functional group in its molecular structure and has high viscosity. After curing, the phenol-formaldehyde resin has high crosslink intensity. The phenol-formaldehyde resin in the present invention can be phenol novolac epoxy resin, o-cresol novolac epoxy resin or bisphenol-based epoxy resin.

The inorganic compound in the binder of the present invention is silicon dioxide ($SiO_2$) or stannous oxide ($SnO_2$). Both of silicon dioxide ($SiO_2$) and stannous oxide ($SnO_2$) can bond to plural substrates stably and firmly. In addition, both silicon dioxide ($SiO_2$) and stannous oxide ($SnO_2$) can improve mechanical strength and tensile strength and decrease expansion coefficient of a conductive film having the oxidation-resistant conductive copper paste of the present invention. Therefore, the conductive film is more metallic and has increased stability and conductivity.

Thixotropic agent is an additive which makes a solution become thixotropic. The thixotropic agent can be used with the cellulose ether of the resin and make the resin glue have increased viscosity in a static state. When the resin glue is stirred by an external force or is coated onto a substrate, the viscosity of thixotropic agent is decrease due to shear forces generated by the external force so as to decrease the viscosity of the resin glue. Therefore, the resin glue is easy to stir or easy to coat onto a substrate. After stirring or coating, the viscosity of the thixotropic agent is recovered, so the resin glue becomes thickened and cannot flow arbitrary due to reduction of fluidity.

The thixotropic reagent of the present invention is a polyamide wax or an oxidized polyethylene wax. The polyamide wax is highly thixotropic and has high sag resistance. The polyamide wax has apparent thixotropic behavior in which the polyamide wax has high viscosity under low shear force and has low viscosity under high shear force. Therefore, the polyamide wax can be applied in different field. The oxidized polyethylene wax is a polar wax and also has thixotropic property.

Since the oxidant-resistant conductive copper paste of the present invention comprises a high proportion of copper particles, using of water as solvent for manufacturing the present invention is avoided to prevent oxidation of the copper particles and reduction of conductivity thereof. Therefore, the solvent for manufacturing the present invention is anhydrous and selected from the group consisting of diethylene glycol monobutyl ether, terpineol and 2, 2, 4-trimethyl-1, 3-pentanediol mono (2-methylpropanoate). The copper particles of the present invention is also insulated from air by using the anhydrous solvent mentioned above which reduces oxidation of the copper particles.

In an embodiment of the present invention, the manufacturing method for oxidation-resistant conductive copper paste comprises the steps of step 1: mixing 50 g of the binder, 10 mL of the thixotropic agent and 200 mL of anhydrous ethanol thoroughly at room temperature to obtain a first mixture in which the binder comprises 20 g of silicon dioxide ($SiO_2$) and 30 g of a mixture comprises cellulose ether phenolic epoxy resin, and the thixotropic agent is polyamide wax; step 2: mixing 30 g of diethylene glycol monobutyl ether with the first mixture thoroughly at room temperature to obtain a second mixture; step 3: mixing 200 g of copper particles with the second mixture thoroughly at room temperature, e.g. by a homogenizer, to obtain a conductive copper paste precursor, wherein the copper particles has a diameter ranging from 300 nm to 1 μm; and step 4: removing the anhydrous ethanol in the conductive copper paste precursor to obtain the oxidation-resistant conductive copper paste. In addition, the oxidation-resistant conductive copper paste can be separated by a roller for removing air bubbles therein. The oxidation-resistant conductive copper paste obtained in the embodiment is called "Sample 1" in the following description.

Figures 2A, 2B:
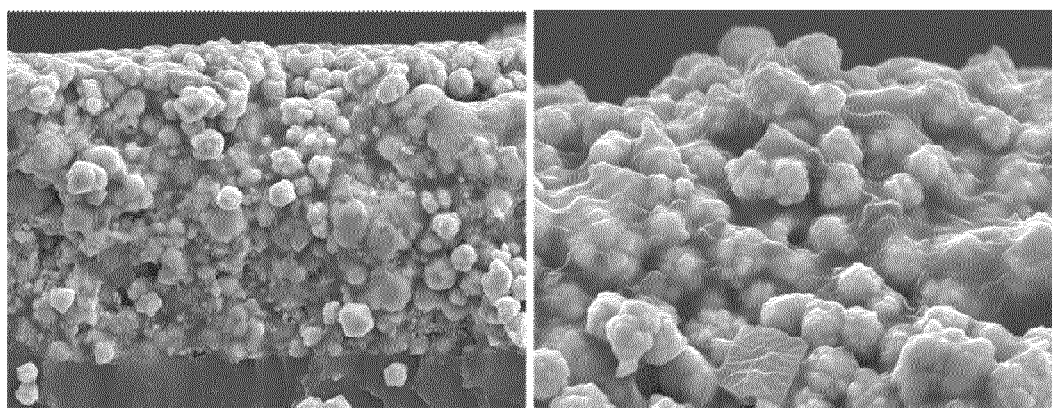
FIG. 2 (A) is a 5000 times-magnified scanning electron microscope photograph showing an oxidation-resistant conductive copper paste after curing of the present invention.

FIG. 2 discloses analyzing photographs obtained by using a scanning electron microscope after Sample 1 is cured. FIG. 2(A) is a 5000 times-magnified photograph, and FIG. 2(B) is a 10000 times-magnified photograph. According to FIG. 2, the oxidation-resistant conductive copper paste of the present invention has composition evenly distributed and has great dispersity; after thermally curing, the copper particles in the oxidation-resistant conductive copper paste are melted as a whole so as to provide great conductivity of the present invention. Moreover, the oxidation-resistant conductive copper paste of the present invention is not easily oxidized. In an embodiment, characters of a conductive film made of the present invention, e.g., an electrode is not altered significantly after incubating in an environment having a temperature of 85° C. and a humidity of 85% for 2000 hours.

II. Preparation of a Conductive Film by Printing

The oxidation-resistant conductive copper paste of the present invention can be applied to manufacture a conductive film by a method comprising the steps of applying the oxidation-resistant conductive copper paste onto a substrate, and thermally curing the oxidation-resistant conductive copper paste under a normal atmosphere to form a conductive film on the substrate. The conductive copper paste is applied on the substrate by means selected from the group consisting of screen printing, coating, dip-coating, spray coating, inkjet printing and combinations thereof. The substrate is a glass substrate, an indium tin oxide glass substrate, a flexible polyamide substrate, a modified polyamide substrate, a polyethylene terephthalate substrate, an electroless nickel immersion gold substrate, a biaxially-oriented polyethylene terephthalate substrate, a silicon substrate, a copper foil substrate, a copper foil soft substrate, a FR4 glass fiber board, a liquid-crystal polymer board or a ceramic board.

When the oxidation-resistant conductive copper paste is screen printed on the substrate for manufacturing a conductive film, a screen-printing plate having a mesh count ranging from 32 meshes to 520 meshes is used. Then, the oxidation-resistant copper paste is thermally cured on the substrate at a temperature of 140° C. to 850° C. for 5 minutes to 120 minutes and adheres to the substrate to obtain a substrate printed with a conductive film.

Figure 3A:
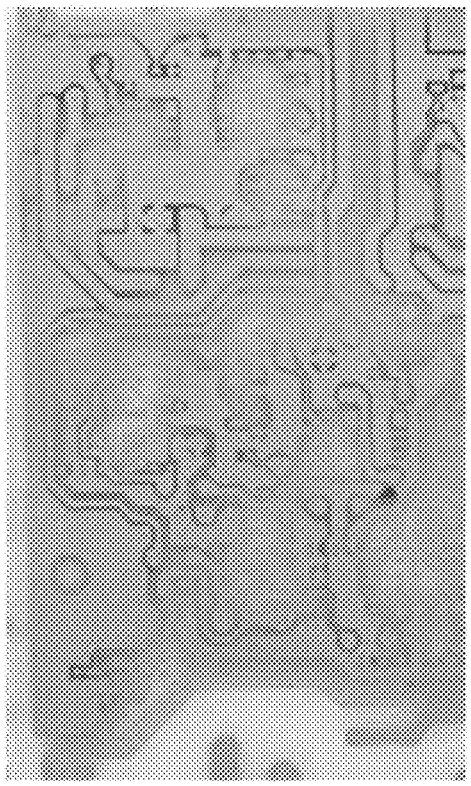
FIG. 3 (A) is a photograph showing a circuit board made of an oxidation-resistant conductive copper paste of the present invention.
Figure 3B:
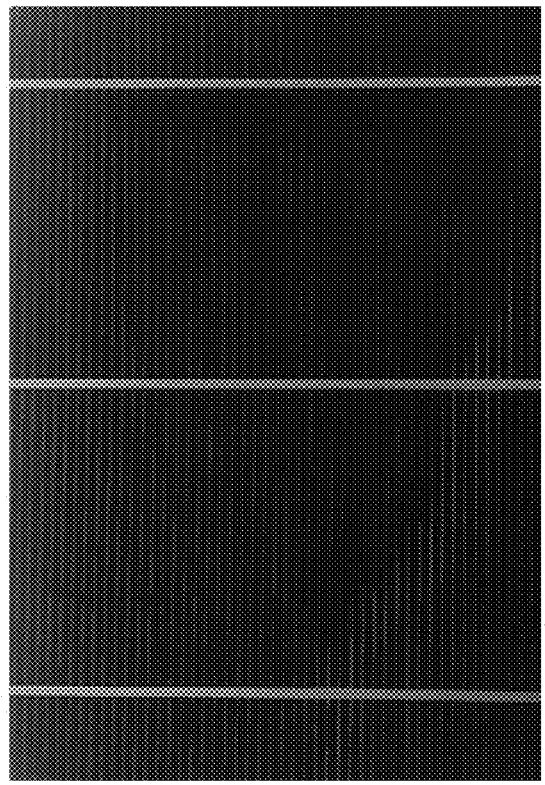

In an embodiment for screen printing of the oxidation-resistant conductive copper paste, moderate amount of Sample 1 is placed in a scree-printing plate having a mesh count of 325 meshes and a tension of 27 NT to 28 NT, then the Sample 1 is coated and thermally cured on a FR4 glass fiber substrate at a temperature of 180° C. for 40 minutes for adhering thereon. FIG. 3(A) shows an embodiment of a circuit board made by printing of the oxidation-resistant conductive copper paste of the present invention on a FR4 glass fiber substrate. The present invention can be also used for manufacturing electrodes of a solar battery. An electrode plate of a solar battery prepared by thermally curing the oxidation-resistant conductive copper paste of the present invention is shown in FIG. 3(B).

In another embodiment, the oxidation-resistant conductive copper paste of the present invention is placed in a screen printing plate having a mesh count of 500 meshes, a tension of 25 NT and a thickness of 12 μm and printed onto a FR4 glass fiber substrate for observation printing precision of the printed FR4 glass fiber substrate. The printed FR4 glass fiber substrate is examined by an optical microscope and a scanning electron microscope, and the microscope photographs are respectively shown in FIG. 4(A) and FIG. 4 (B). According to FIG. 4(A) and FIG. 4 (B), the oxidation-resistant conductive copper paste screen-printed on the substrate has a line width of at least 40 μm and a thickness of 5 μm to 10 μm.

III. Adhesion Test of the Oxidation-Resistant Conductive Copper Paste

Figure 5:
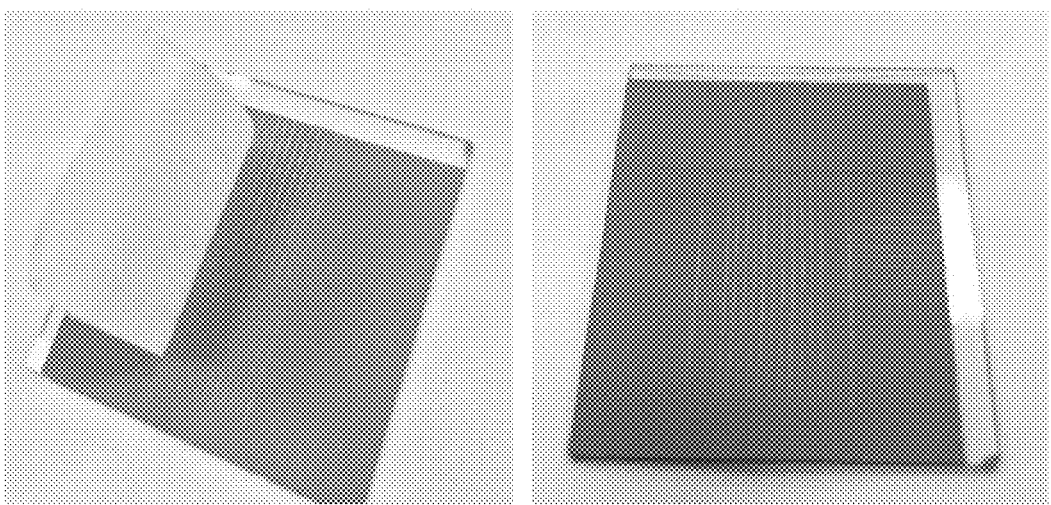
FIG. 5 is an analysis diagram of a cross-cut adhesion test of an oxidation-resistant conductive copper paste of the present invention.

In the following embodiment, adhesion of the oxidation-resistant conductive copper paste coated on a substrate is examined by a cross-cut adhesion test. The Sample 1 describes above is coated on a substrate and thermally cured at a temperature of 200° C. for 40 minutes to obtain a printed substrate having a conductive film. The printed substrate having a conductive film is scratched by a cross cut tester into the copper paste coated thereon to form a grid pattern in which the grid pattern is penetrating all the way to the substrate. An industrial test tape manufactured by the 3M company (cat No: 3M #600) or a tape has a same stickiness is stuck on an area to be tested of the printed substrate having a conductive film and pressed by an eraser for sticking the tape on the area to be tested firmly and uniformly. Then, the industrial test tape is ripped off quickly by one end in a vertical direction. The same area is tested twice for examining adhesion ability of the oxidation-resistant conductive copper paste of the present invention on a substrate. The printed substrate having a conductive film tested by the cross-cut adhesion test is shown in FIG. 5. As shown in FIG. 5, the conductive film formed by the oxidation-resistant conductive copper paste thermally cured on the glass substrate is completely attached on the glass substrate after the industrial test tape is ripped off which suggested that the oxidation-resistant conductive copper paste has great adhesion ability. After valuation, the printed substrate having a conductive film has a ISO class ≤1 and an ASTM class ≥5.

In addition, the printed substrate having a conductive film made of the oxidation-resistant conductive copper paste of the present invention has a resistivity ranging from $10^{-3}$ $\Omega$-cm to $10^{-7}$ $\Omega$-cm. Therefore, the printed substrate having a conductive film has great conductivity.

IV. Oxidation-Resistance Test

Figure 6A:
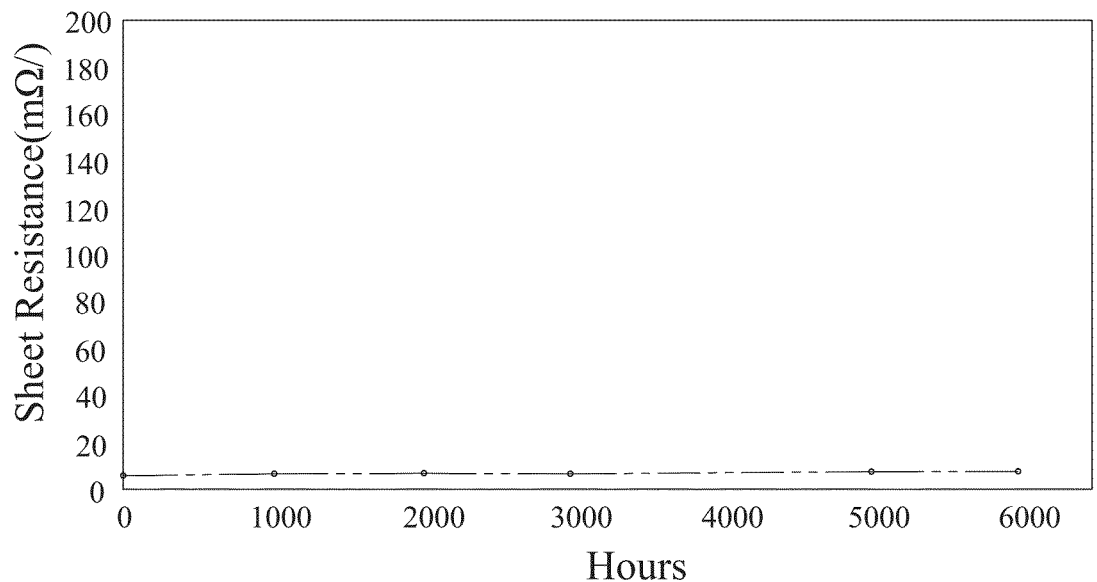
FIG. 6 (A) is a first analysis diagram showing sheet resistance of an oxidation-resistant conductive copper paste of the present invention.
Figure 6B:
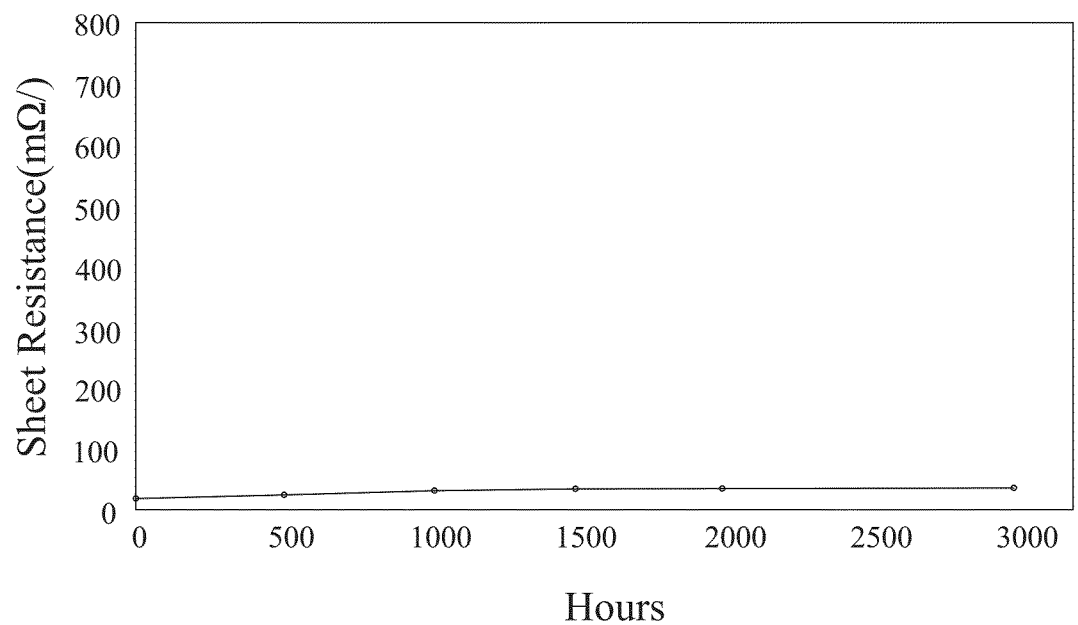

The printed substrate having a conductive film made of the oxidation-resistant conductive copper paste of the present invention is treated under a high temperature and a high humidity condition for at least 3000 hours, and changing of the sheet resistance of the printed substrate having a conductive film is examined. In one embodiment, the printed substrate having a conductive film is treated under a temperature of 65° C. and a relative humidity of 65% for 1000 hours to 6000 hours, and the sheet resistance of the printed substrate having a conductive film is analyzed at different time points as shown in FIG. 6(A). According to FIG. 6(A) the sheet resistances of the printed substrate having a conductive film at different time pointes are stable which indicate that the printed substrate having a conductive film can maintain stability for at least 25 years under room temperature. In a second embodiment, the printed substrate having a conductive film is treated under a temperature of 85° C. and a relative humidity of 85% for 500 hours to 3000 hours, and the sheet resistance of the printed substrate having a conductive film is analyzed at different time points as shown in FIG. 6(B). According to FIG. 6(B), the sheet resistances of the printed substrate having a conductive film at different time pointes are stable which indicate that the printed substrate having a conductive film can maintain stability for at least 25 years under room temperature. The analyzed result shown in FIG. 6 suggested that the oxidation-resistant conductive copper paste is stable and oxidation resistant, and the printed substrate having a conductive film made of the present invention can maintain conductive stability under high temperature and high humidity and the present invention.

Compared to the prior art, the oxidation-resistant conductive copper paste prepared by the method of the present invention comprises higher percentage of copper particles, and the oxidation-resistant conductive copper paste has great dispersity, adhesion ability, conductivity, and oxidation-resistance. In addition, the present invention has great stability and low manufacturing cost. Moreover, the oxidation-resistant conductive copper paste also has great heat resistant and the heat resistant temperature of the present invention ranges from 140° C. to 850° C.

What is claimed is:

1. An oxidation-resistant conductive copper paste, comprising 70 wt % to 90 wt % of conductive particles, 4 wt % to 16 wt % of a binder comprising an organic resin and an inorganic compound, 0.5 wt % to 7 wt % of a thixotropic agent and 5 wt % to 25 wt % of a solvent, wherein the conductive particles is selected from the group consisting of nano-sized copper particles, submicron-sized copper particles and micron-sized copper particles, wherein the organic resin includes a phenol-formaldehyde resin, wherein the inorganic compound includes stannous oxide ($SnO_2$), and wherein the solvent is selected from a group consisting of diethylene glycol monobutyl ether, 2, 2, 4-trimethyl-1, 3-pentanediol mono (2-methylpropanoate), and a combination thereof.

2. The oxidation-resistant conductive copper paste as claimed in claim 1, wherein each of the conductive particles has a diameter ranging from 50 nm to 3000 nm.

3. The oxidation-resistant conductive copper paste as claimed in claim 1, wherein the organic resin further includes a cellulose ether or a phenolic epoxy resin, and wherein the inorganic compound further includes silicon dioxide ($SiO_2$).

4. The oxidation-resistant conductive copper paste as claimed in claim 1, wherein the thixotropic agent is selected from a group consisting of a polyamide wax and an oxidized polyethylene wax.

* * * * *